US012560653B2

(12) United States Patent
Liu et al.

(10) Patent No.: US 12,560,653 B2
(45) Date of Patent: Feb. 24, 2026

(54) LEBESGUE SAMPLING-BASED LITHIUM-ION BATTERY STATE-OF-CHARGE DIAGNOSIS AND PROGNOSIS

(71) Applicant: UNIVERSITY OF SOUTH CAROLINA, Columbia, SC (US)

(72) Inventors: Enhui Liu, Columbia, SC (US); Bin Zhang, Irmo, SC (US)

(73) Assignee: UNIVERSITY OF SOUTH CAROLINA, Columbia, SC (US)

( * ) Notice: Subject to any disclaimer, the term of this patent is extended or adjusted under 35 U.S.C. 154(b) by 829 days.

(21) Appl. No.: 17/854,980

(22) Filed: Jun. 30, 2022

(65) Prior Publication Data

US 2023/0003802 A1     Jan. 5, 2023

Related U.S. Application Data

(60) Provisional application No. 63/217,450, filed on Jul. 1, 2021.

(51) Int. Cl.
*G01R 31/367* (2019.01)
*G01R 31/3835* (2019.01)
*G01R 31/392* (2019.01)

(52) U.S. Cl.
CPC ....... *G01R 31/367* (2019.01); *G01R 31/3835* (2019.01); *G01R 31/392* (2019.01)

(58) Field of Classification Search
CPC . G01R 31/367; G01R 31/3835; G01R 31/392
See application file for complete search history.

(56) References Cited

U.S. PATENT DOCUMENTS

2018/0315992 A1* 11/2018 Du ........................ H01M 4/621

OTHER PUBLICATIONS

Yan et al. "State-of-Charge Estimation of Lithium-ion Batteries by Lebesgue Sampling-Based EKF Method", IECON 2017—43rd Annual Conference of the IEEE Industrial Electronics Society, (Dec. 2017).*

(Continued)

*Primary Examiner* — Jack Chiang
*Assistant Examiner* — Brandon Bowers
(74) *Attorney, Agent, or Firm* — DORITY & MANNING, P.A.

(57) ABSTRACT

Method provides accurate state-of-health (SOH) diagnostics and prognostics during the whole-life-service of a lithium-ion battery by considering the effects of state-of-charge (SOC) and SOH on certain parameters (such as consideration of nonlinearity of the terminal voltage) during the process of SOC diagnostics and prognostics. The method integrates Lebesgue sampling and equivalent circuit model (ECM) analysis, which greatly decreases computation cost and uncertainty accumulation to provide efficient acquisition of open circuit voltage (OCV) determinations for the ECM process. The OCV curve of the battery was obtained during Hybrid Pulse Power Characterization testing by fitting a series of selected OCV points after enough rest of the subject battery. Identified parameters of ECM are updated according to terminal voltage measurement to enable accurate SOC estimation and prediction during the period from full charge to full discharge of the battery. Parameter identification is re-conducted and an initial condition for SOC estimation is updated according to SOH to enable accurate SOC estimation during the whole-life-service of battery.

17 Claims, 4 Drawing Sheets

(56) References Cited

OTHER PUBLICATIONS

Battery Test Manual for Plug-In Hybrid Electric Vehicles, The Idaho National Laboratory, (Mar. 2008).*

* cited by examiner

LEBESGUE SAMPLING-BASED LITHIUM-ION BATTERY STATE-OF-CHARGE DIAGNOSIS AND PROGNOSIS

PRIORITY CLAIM

The present application claims the benefit of priority of U.S. Provisional Patent Application No. 63/217,450, titled Lithium-Ion Battery State-Of-Charge Diagnosis and Prognosis, filed Jul. 1, 2021, which is fully incorporated herein by reference for all purposes.

FIELD OF THE PRESENTLY DISCLOSED SUBJECT MATTER

The present disclosure relates generally to batteries. More particularly, the present disclosure relates to state-of-charge diagnosis and prognosis for lithium-ion batteries using Lebesgue-sampling equivalent circuit model techniques.

BACKGROUND OF THE PRESENTLY DISCLOSED SUBJECT MATTER

Generally speaking, battery technology is a critical component of industrial systems, electric cars, and aerospace areas. Hundreds of companies around the world are conducting related work involving the lithium (Li)-battery. The anticipated market size is over $150 billion by 2030. The Li-battery has a bright future, and it will change our world due to its high energy density, voltage capacity, and lower self-discharge rate than other rechargeable batteries.

Traditional state-of-charge (SOC) estimation and prediction is mainly based on the electrochemical model or on the equivalent circuit model (ECM) of a Li-battery. Even though the electrochemical model can describe the internal electrochemical reaction mechanism of Li-battery accurately, the high computation cost hinders its embedded applications. On the contrary, the computation cost of the ECM is low, but it cannot simulate the behavior of Li-battery accurately with fixed parameters. Additionally, the traditional way to obtain open circuit voltage (OCV) used for terminal voltage calculation and SOC estimation is to discharge the battery during the period from full charge to full discharge of the battery at a small rate (usually 0.02° C.) over a long period of time (e.g., more than 50 hours).

SUMMARY OF THE PRESENTLY DISCLOSED SUBJECT MATTER

Aspects and advantages of embodiments of the present disclosure will be set forth in part in the following description, or can be learned from the description, or can be learned through practice of the embodiments.

The presently disclosed subject matter identifies the parameters of the ECM with consideration of the nonlinearity of the terminal voltage, which lays foundation to overcome the low fidelity of the ECM of Li-batteries by updating the parameters according to the measured terminal voltage. Meanwhile, it greatly decreases the time cost of obtaining the OCV by fitting a series of OCV points which are defined as measured terminal voltage points after enough rest time of the battery. Moreover, the integration between Lebesgue sampling (LS) and the ECM for SOC diagnostics and prognostics results in low computation and small uncertain accumulation, which enables the realization of embedded online applications possible. Finally, the presently disclosed subject matter enables accurate SOC diagnostics and prognostics by re-conducting parameter identification and initializing SOC condition during the whole life service of the battery.

The presently disclosed method subject matter overcomes the drawback of the traditional parameter identification and OCV acquirement method and considers the effects of SOC and state-of-health (SOH) on the parameters during the process of SOC diagnostics and prognostics, which results in efficient OCV acquirement and in accurate SOC diagnostics and prognostics during the whole life service of the battery. Moreover, the presently disclosed method integrates LS and ECM, which greatly decreases the computation cost and uncertainty accumulation. Compared with traditional OCV acquirement, SOC diagnostics and prognostics method, the presently disclosed method significantly improves the efficiency, simplifies the process, and improves accuracy.

One exemplary presently disclosed method relates to providing accurate SOH diagnostics and prognostics during the whole life service of a lithium-ion battery by considering the effects of SOC and SOH on certain parameters (such as consideration of nonlinearity of the terminal voltage) during the process of SOC diagnostics and prognostics. One exemplary method integrates LS and ECM analysis, which greatly decreases computation cost and uncertainty accumulation to provide efficient acquisition of OCV determinations for the ECM process.

For some embodiments, the OCV curve of the battery is obtained during Hybrid Pulse Power Characterization (HPPC) testing by fitting a series of selected OCV points after enough rest of the subject battery. For example, rest on the order of minutes, such as several minutes may, in some instances, be sufficient. In some embodiments, a rest of at least five minutes may be practiced. Identified parameters of ECM, in some instances, are updated according to terminal voltage measurement to enable accurate SOC estimation and prediction during the period from full charge to full discharge of the battery. Parameter identification may, in some instances, be re-conducted and an initial condition for SOC estimation is updated according to SOH to enable accurate SOC estimation during the whole life service of battery.

One exemplary embodiment in accordance with presently disclosed subject matter relates to a method for performing SOC diagnosis and prognosis for lithium-ion batteries, including conducting ECM analysis for a subject battery based on established parameters, wherein said established parameters include consideration of nonlinearity of the subject battery terminal voltage over time and using LS acquisition of OCV determinations for use in the ECM analysis.

Another exemplary embodiment of presently disclosed subject matter relates to methodology for accurate SOC estimation and prediction of a subject Li-battery by identifying parameters for ECM analysis of the subject Li-battery so as to account for nonlinearity of the subject Li-battery terminal voltage over time, including updating the parameters according to the measured terminal voltage of the subject Li-battery.

Yet another presently disclosed exemplary embodiment relates to a method for providing accurate SOH diagnostics and prognostics during the whole life service of a lithium-ion battery by considering the effects of SOC and SOH on certain parameters for ECM analysis during the process of SOC diagnostics and prognostics. Such method exemplary embodiments preferably include integrating LS and ECM analysis for acquiring OCV determinations for the ECM process while accounting for nonlinearity of the subject battery terminal voltage over time by updating the ECM parameters according to the measured terminal voltage of the subject battery over time.

Other aspects of the present disclosure are directed to use of various systems, apparatuses, non-transitory computer-readable media, user interfaces, and electronic devices for implementation of corresponding and/or associated presently disclosed methods and methodologies.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the Figures or stated in the detailed description of such Figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, will appreciate that the presently disclosed subject matter applies equally to corresponding methodologies as associated with practice of any of the present exemplary devices and vice versa.

These and other features, aspects, and advantages of various embodiments of the present disclosure will become better understood with reference to the following description and appended claims. The accompanying figures, which are incorporated in and constitute a part of this specification, illustrate example embodiments of the present disclosure and, together with the description, serve to explain the related principles.

BRIEF DESCRIPTION OF THE FIGURES

A full and enabling disclosure of the presently disclosed subject matter, including the best mode thereof, directed to one of ordinary skill in the art, is set forth in the specification, which makes reference to the appended Figures, in which.

Figure 1:
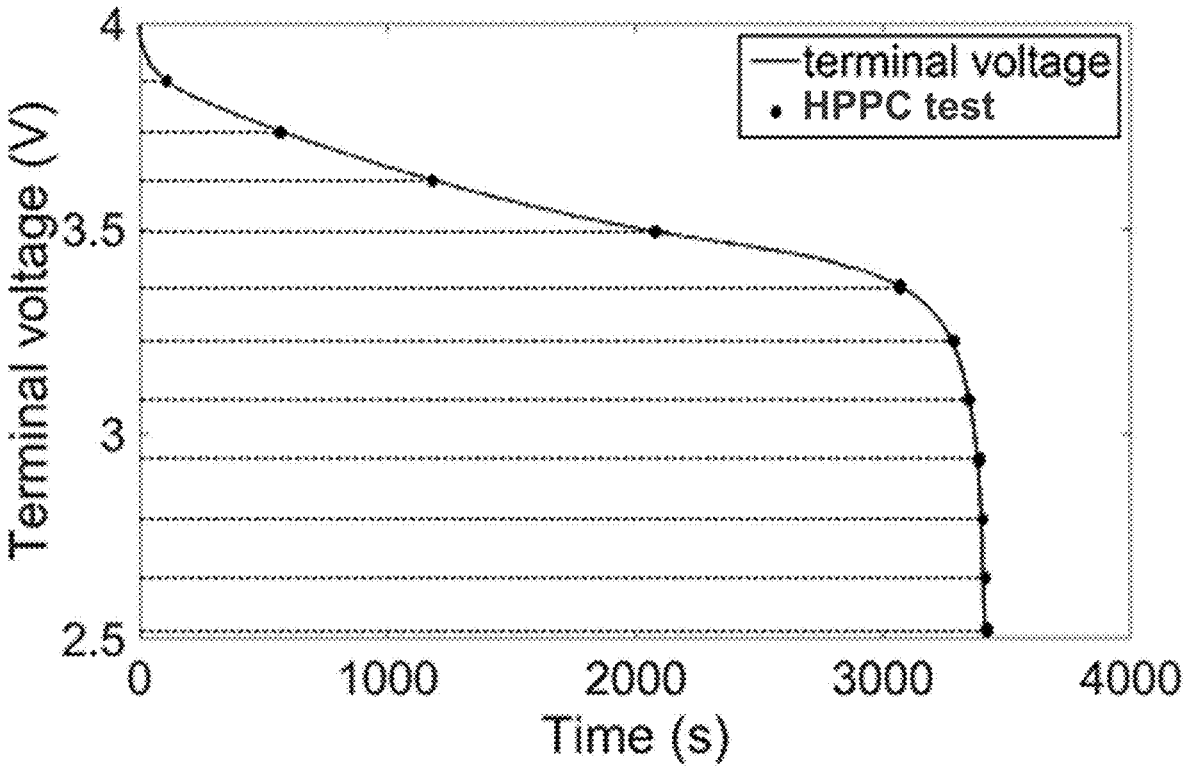
FIG. 1 depicts an example graphical representation of a terminal voltage curve graphed, along with a plot of HPPC test results for specific such voltages depending on the number of seconds after charging, in accordance with the presently disclosed subject matter.

Repeat use of reference characters in the present specification and figures is intended to represent the same or analogous features or elements or steps of the presently disclosed subject matter.

DETAILED DESCRIPTION OF THE PRESENTLY DISCLOSED SUBJECT MATTER

Reference now will be made in detail to embodiments, one or more examples of which are illustrated in the figures. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Exemplary aspects of the present disclosure are directed to batteries, and more particularly, to SOC diagnosis and prognosis for lithium-ion batteries.

Generally, the present disclosure is directed to lithium-ion battery SOC diagnosis-prognosis based on LS ECM technique.

Parameter identification is an aspect of ECM analysis. In some instances, OCV curve acquirement is used for ECM analysis. HPPC testing is conducted according to the nonlinearity of the terminal voltage to obtain a set of parameters of ECM with respect to terminal voltage. In particular, in some embodiments, measured terminal voltage points are selected after the subject battery rests (i.e., the applied input current is zero) for enough time as OCV points. From there, the OCV curve of the battery is obtained by fitting a series of selected OCV points.

The HPPC test is re-conducted, and the SOC is initialized based on SOH data. In this context, SOH refers to the condition of a battery relative to its ideal conditions. For example, the SOH of a battery may be referenced at 100% at the time of manufacture, and then decrease over time as a result of its use. Within that context, diagnosis and prognosis of SOC is a present level of battery charge compared to capacity (e.g., in percentage, 0%=empty; 100%=full).

Per presently disclosed exemplary subject matter, in some instances, the ECM analysis may be integrated with Extended Kalman Filter (EKF) estimation theory to estimate SOC by calculating OCV of the battery with the parameters of ECM according to terminal voltage.

In some embodiments disclosed herewith, the SOC diagnostic algorithm may be conducted if a new measurement (terminal voltage) reaches the pre-defined Lebesgue states. The SOC prognostic algorithm is executed based on the LS model to estimate distributions of operating time for the diagnostic SOC reaching each Lebesgue state.

Per presently disclosed exemplary subject matter, in some instances, SOH and SOC estimation of whole-life-service Li-Battery may be based on simplified first principles model under an LS framework. Stated another way, the presently disclosed subject matter, in some instances, may relate to LS-based battery whole-life-service SOC estimation using simplified first principles model.

Parameter identification of ECM is conducted in accordance with presently disclosed subject matter with consideration of the nonlinearity of the terminal voltage, which enables the ECM with identified parameters. In some instances, the OCV curve of the battery is obtained during HPPC test by fitting a series of selected OCV points after enough rest of the subject battery. The proposed LS framework combines ECM and LS method for SOC diagnostics and prognostics, which results in low computation and small uncertainty accumulation. With a set of identified parameters of ECM, the parameters are updated according to terminal voltage measurement to enable accurate SOC estimation and prediction during the period from full charge to full discharge of the battery. The parameters identification is re-conducted and initial condition for SOC is updated according to SOH to enable accurate SOC estimation during the whole life service of the battery.

With reference now to the Figures, example embodiments of the present disclosure will be discussed in further detail.

Figure 2:
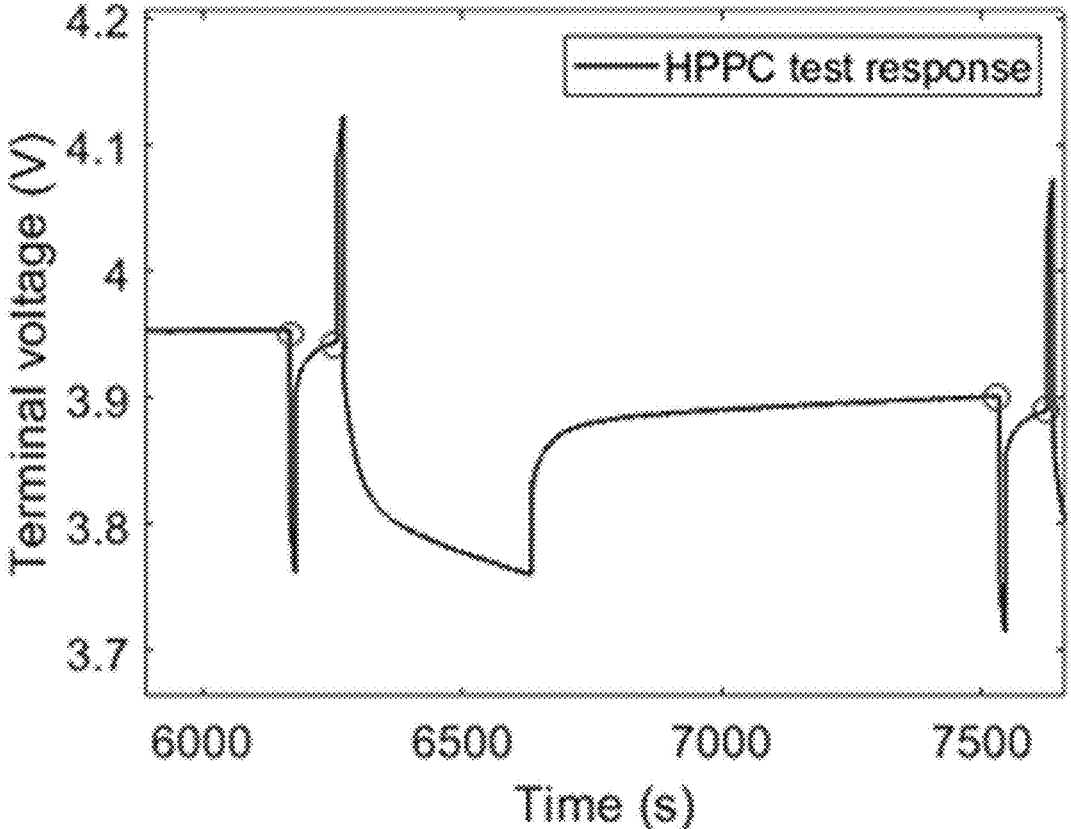
FIG. 2 similarly illustrates a graph of HPPC test response of terminal voltage tracked relative to number of recharging times, in accordance with the presently disclosed subject matter.
Figure 3:
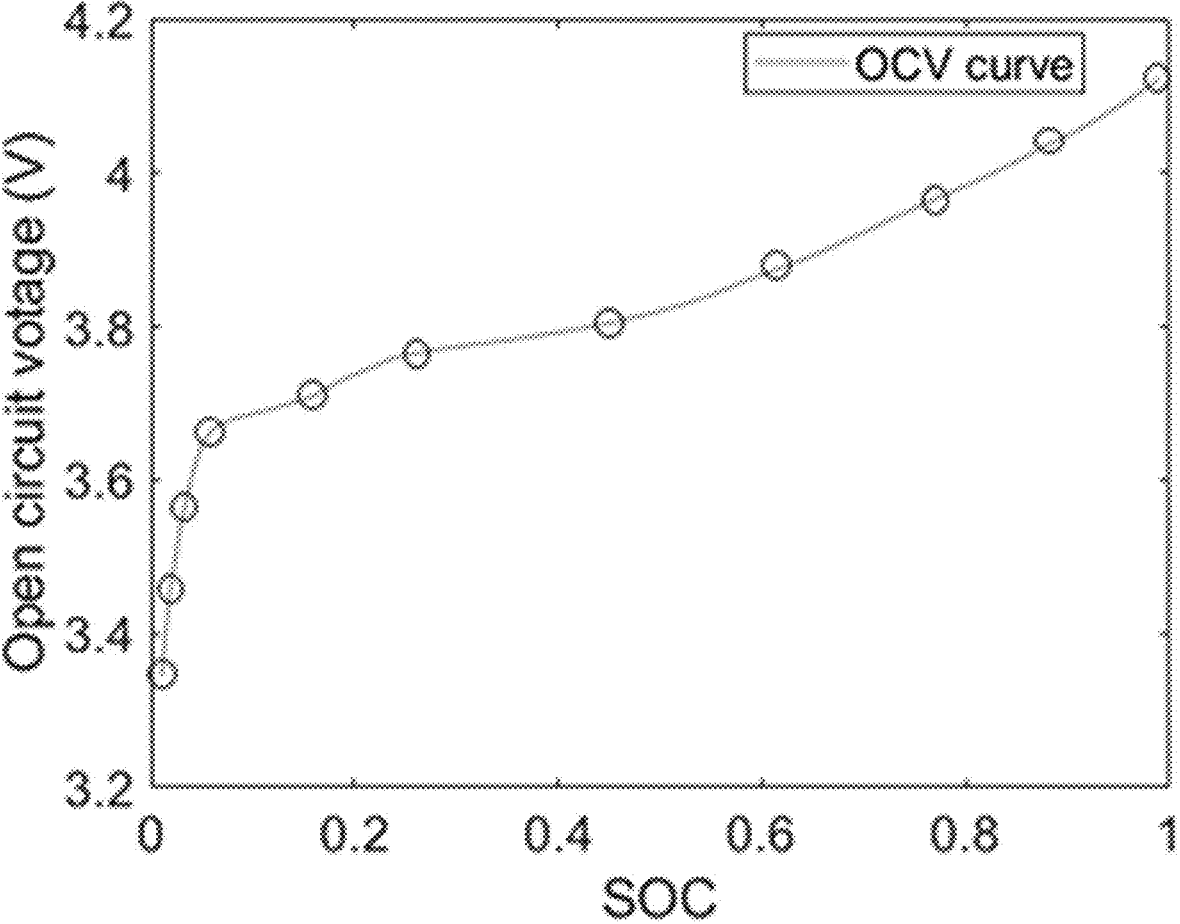
FIG. 3 graphically represents the OCV (curve) relative to SOC. Such SOC scale is represented full scale from 0 to 1, corresponding with 0% to 100%, in accordance with the presently disclosed subject matter.

FIG. 1 depicts an example graphical representation of a terminal voltage curve graphed, along with a plot of HPPC test results for specific such voltages depending on the number of seconds after charging, in accordance with the presently disclosed subject matter. FIG. 2 similarly illustrates a graph of HPPC test response of terminal voltage tracked relative to number of recharging times, in accordance with the presently disclosed subject matter. FIG. 3 graphically represents the OCV (curve) relative to SOC. Such SOC scale is represented full scale from 0 to 1, corresponding with 0% to 100%, in accordance with the presently disclosed subject matter.

Figure 4:
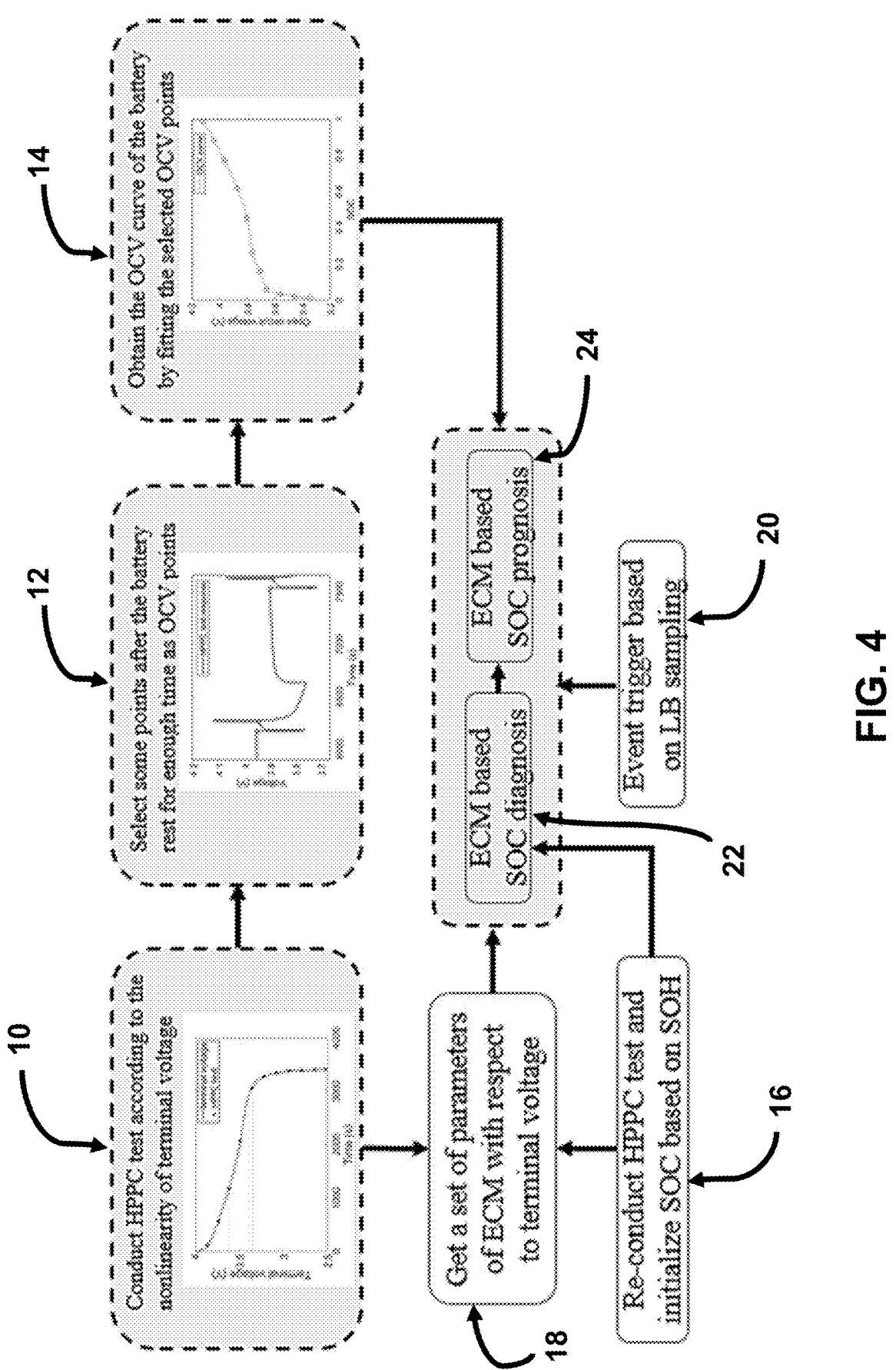
FIG. 4 illustrates a representative flow chart of an exemplary embodiment of presently disclosed subject matter for SOC diagnostics and prognostics of whole-life-service Li-battery.

An exemplary embodiment of presently disclosed methodology is shown by the flow chart of FIG. 4, which reproduces/uses, in part, the graphical information/data represented in application FIGS. 1-3. In particular, SOC diagnostics and prognostics for whole-life-service of a subject Li-battery are based on ECM analysis under LS framework, as represented.

As shown by FIG. 4, a first step generally 10 in overall methodology is to conduct HPPC testing according to the nonlinearity of the terminal voltage. The conduct and results of such a step are precisely what are represented by FIG. 1, which depicts a graphical representation of a terminal voltage curve along with a plot of such HPPC test results for specific such voltages depending on the number of seconds after charging. As shown by such flow chart of FIG. 4, another step generally 12 is similarly represented by FIG. 2, whereby some points are selected as OCV points after the subject battery has had enough time to rest. Rest in such context refers to the applied input current to the battery is zero. The length of time of rest may vary in different embodiments. In some embodiments, a rest time period of at least about five minutes may be practiced. Lastly, with reference to prior application Figures, step generally 14 represents the subject matter of application FIG. 3, whereby the OCV curve of the subject battery is obtained by fitting the selected OCV points.

Step generally 16 of the exemplary methodology flow chart represents re-conducting of the HPPC test and initializing the SOC based on the SOH. Once such step 16 is re-conducted, step generally 18 involves getting a set of parameters of ECM with respect to terminal voltage. As further represented by FIG. 4, an event trigger generally 20 may be based on LS. At such stage, outputs of steps 16 and 18 may be used for the ECM analysis of step generally 22, whereby the SOC is diagnosed, i.e., determined. Per step generally 24, the SOC prognosis is thereafter developed.

The overall flow chart serves to demonstrate how the presently disclosed interaction of various steps results in parameter identification and OCV curve acquirement of ECM. It further demonstrates that the HPPC test is conducted according to the nonlinearity of the terminal voltage to obtain a set of parameters of ECM with respect to terminal voltage. The terminal voltage points are selected as OCV points after the battery rests for enough time. FIG. 4 further represents that the OCV curve of the battery is obtained by fitting a series of selected OCV points, and that the HPPC test is then re-conducted, and the SOC is initialized based on SOH.

LS based SOC diagnosis and prognosis in accordance with exemplary embodiments of the presently disclosed subject matter involves the following: 1) In particular, the ECM is integrated with Extended Kalman Filter estimation theory and used to diagnosis SOC by calculating OCV of the battery with the parameters of ECM according to terminal voltage; 2) The LS-based SOC diagnostic algorithm is conducted if a new measurement (terminal voltage) reaches the predefined Lebesgue states; and 3) The LS-based SOC prognostic algorithm is executed based on the LS model to estimate distributions of operating time for the diagnostic SOC reaching each Lebesgue state.

Various aspects and/or advantages of the presently disclosed subject matter may relate in part to the following. For example, the parameter identification of ECM is conducted with the consideration of nonlinearity of the terminal voltage, which enables the ECM with identified parameters to describe the behavior of the battery well in the entire service life span of the battery.

The OCV curve of the battery is obtained during HPPC test by fitting a series of selected OCV points.

The proposed LS framework combines ECM and LS method for SOC diagnostics and prognostics, which results in low computation and small uncertainty accumulation.

With a set of identified parameters of ECM, the parameters are updated according to terminal voltage measurements to enable accurate SOC diagnostics and prognostics during the period from full charge to full discharge of the battery.

The parameters identification is re-conducted and the initial condition for SOC is updated according to SOH to enable accurate SOC diagnostics and prognostics during the whole life service of battery.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations, and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents. Accordingly, the scope of the present disclosure is by way of example rather than by way of limitation, and the subject disclosure does not preclude inclusion of such modifications, variations, and/or additions to the present subject matter as would be readily apparent to one of ordinary skill in the art.

What is claimed is:

1. Method for performing state-of-charge (SOC) diagnosis and prognosis for lithium-ion batteries, including:
   conducting equivalent circuit model (ECM) analysis for a subject battery based on established parameters, wherein said established parameters includes consideration of nonlinearity of the subject battery terminal voltage over time; and
   using Lebesgue sampling acquisition of open circuit voltage (OCV) determinations for use in the ECM analysis, wherein said OCV determinations are conducted according to the nonlinearity of the terminal voltage to update a set of parameters for ECM analysis which is dynamically adjusted over the whole life service of the subject battery.

2. The method of claim 1, further including obtaining the OCV curve of the subject battery by conducting Hybrid Pulse Power Characterization testing on the subject battery after rest of the subject battery and fitting a series of selected OCV points to form the OCV curve.

3. The method of claim 2, further including updating established parameters for ECM analysis according to periodic terminal voltage measurements to enable accurate SOC estimation and prediction during the period from full charge to full discharge of the subject battery.

4. The method of claim 3, further including periodically re-conducting parameter establishment and updating an initial condition for SOC estimation according to state-of-health (SOH) of the subject battery to enable accurate SOC estimation during the whole life service of the subject battery.

5. The method of claim 1, wherein SOC diagnosis is conducted if a new measurement of terminal voltage reaches pre-defined Lebesgue states.

6. The method of claim 5, wherein SOC prognosis is conducted based on the Lebesgue sampling model to estimate distributions of operating time for the SOC diagnosis reaching each Lebesgue state.

7. The method of claim 1, wherein SOC is diagnosed by calculating OCV of the subject battery for parameters of ECM analysis according to terminal voltage of the subject battery.

8. The method of claim 2, wherein the Hybrid Pulse Power Characterization testing is conducted according to the nonlinearity of the terminal voltage to obtain a set of parameters for ECM analysis with respect to terminal voltage after the applied input current to the subject battery is zero.

9. The method of claim 5, wherein the SOC diagnosis is integrated with Extended Kalman Filter estimation theory to diagnosis SOC by calculating OCV of the subject battery with the parameters of ECM analysis according to terminal voltage of the subject battery.

10. Methodology for performing state-of-charge (SOC) diagnosis and prognosis for lithium-ion batteries, including performing accurate state-of-charge (SOC) estimation and prediction of a subject Li-battery by identifying parameters for equivalent circuit model (ECM) analysis of the subject Li-battery so as to account for nonlinearity of the subject Li-battery terminal voltage over time, and further including updating the parameters according to the measured terminal voltage of the subject Li-battery, wherein open circuit voltage (OCV) determinations are made according to the nonlinearity of the subject Li-battery terminal voltage to update a set of parameters for ECM analysis which is dynamically adjusted over the whole life service of the subject battery.

11. Methodology as in claim 10, further including obtaining a curve of OCV values for ECM analysis of the subject Li-battery by conducting Hybrid Pulse Power Characterization testing on the subject Li-battery after rest of the subject battery and fitting a series of selected OCV points using Lebesgue sampling to form the OCV curve.

12. Methodology as in claim 11, further including periodically re-conducting parameter establishment and updating an initial condition for SOC estimation according to state-of-health (SOH) of the subject Li-battery to enable accurate SOC estimation during the whole life service of the subject Li-battery.

13. Methodology as in claim 11, wherein terminal voltage points are selected as OCV points for ECM analysis after the subject battery rests from input current for a period of time.

14. Methodology as in claim 11, wherein rest of the subject battery is a period of time of at least five minutes.

15. A method for providing accurate state-of-health (SOH) diagnostics and prognostics during the whole life service of a lithium-ion battery, including considering the effects of state-of-charge (SOC) and SOH on certain parameters for equivalent circuit model (ECM) analysis during the process of SOC diagnostics and prognostics, and further including integrating Lebesgue sampling and ECM analysis, for acquiring open circuit voltage (OCV) determinations for the ECM process while accounting for nonlinearity of the subject battery terminal voltage over time by at least periodically updating the ECM parameters according to the measured terminal voltage over the whole life service of the subject battery over time.

16. The method of claim 15, wherein the OCV determinations are obtained during Hybrid Pulse Power Characterization testing by fitting a series of selected OCV points after rest of the subject battery from input current.

17. The method of claim 16, wherein rest of the subject battery from input current is at least about five minutes.

* * * * *